(12) United States Patent
Adams et al.

(10) Patent No.: US 7,308,621 B2
(45) Date of Patent: Dec. 11, 2007

(54) TESTING OF ECC MEMORIES

(75) Inventors: R. Dean Adams, St. George, VT (US); Gerard M. Salem, Essex Junction, VT (US); Timothy J. von Reyn, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 442 days.

(21) Appl. No.: 10/063,495

(22) Filed: Apr. 30, 2002

(65) Prior Publication Data

US 2003/0204795 A1 Oct. 30, 2003

(51) Int. Cl.
*G11C 29/00* (2006.01)
*G01R 21/28* (2006.01)

(52) U.S. Cl. .................. 714/718; 714/733; 714/763

(58) Field of Classification Search ............. 714/718, 714/709, 710, 719, 723, 724, 733, 738, 758
See application file for complete search history.

(56) References Cited

U.S. PATENT DOCUMENTS

| | | | |
|---|---|---|---|
| 4,335,459 A | 6/1982 | Miller | |
| 4,891,811 A | 1/1990 | Ash et al. | |
| 5,134,616 A | 7/1992 | Barth, Jr. et al. | |
| 5,511,029 A | 4/1996 | Sawada et al. | 365/201 |
| 5,535,164 A | 7/1996 | Adams et al. | 365/201 |
| 5,561,671 A | 10/1996 | Akiyama | |
| 5,587,950 A | 12/1996 | Sawada et al. | 365/201 |
| 5,617,531 A | 4/1997 | Crouch et al. | 395/183.06 |
| 5,689,466 A | 11/1997 | Qureshi | 365/201 |
| 5,831,989 A * | 11/1998 | Fujisaki | 714/723 |
| 5,907,561 A | 5/1999 | Blish, II et al. | |
| 6,026,505 A * | 2/2000 | Hedberg et al. | 714/711 |
| 6,070,256 A | 5/2000 | Wu et al. | 714/718 |
| 6,118,711 A | 9/2000 | Merritt | 365/200 |
| 6,205,564 B1 | 3/2001 | Kim et al. | 714/48 |
| 6,792,567 B2 * | 9/2004 | Laurent | 714/763 |

OTHER PUBLICATIONS

Technique of Using Compressed Bit-Map for Memory Utilization, Research Disclosure, Apr. 1991, No. 324, Disclosure 32412.
"Enhanced Memory Addressing Diagnostics for Intermediate Systems", IBM Tech. Discl. Bull.1, vol. 34, No. 5, Oct. 1991, pp. 323-325.

* cited by examiner

*Primary Examiner*—James C Kerveros
(74) *Attorney, Agent, or Firm*—W. Riyon Harding

(57) ABSTRACT

A BIST system that utilizes ECC to correct single bit errors in a given memory word at a given address, the ECC having a maximum number of bit errors it can correct in the given memory word. A first set of gates is coupled to an array of memory cells that stores a plurality of memory words, each at a given address. The first set of gates provides bit outputs indicative of errors in a given memory word while the given memory word is under test. A circuit coupled to respective outputs of the first set of gates determines if a number of errors in the memory word under test exceeds the maximum number of errors correctable by the ECC.

19 Claims, 4 Drawing Sheets

TESTING OF ECC MEMORIES

CROSS REFERENCE TO RELATED APPLICATIONS

Reference is made to co-pending U.S. patent application Ser. No. 10/063,497, filed Apr. 30, 2002, entitled "Optimized ECO/Redundancy Fault Recovery".

BACKGROUND OF THE INVENTION

Technical Field

The present invention relates generally to the field of testing memory arrays, and more particularly to testing memory arrays with ECC circuitry.

In general, in the fabrication of integrated circuits it is important to test the circuits once fabricated to assure they meet the requisite quality and reliability targets for the targeted product application. In memory technologies (be they dynamic random access memories (DRAM); static RAM; or embedded RAM) it is particularly important to conduct these tests so as to identify and replace faulty storage cells, such that the memory chip can still meet the product application.

Such memories are regular structures which have well defined test pattern sets. By "regular," we mean tat a memory array typically has a repeating topology and sequence of transistors and other structures, such that failure mechanisms tend to affect the device in relatively uniform ways, and tend to accurately follow well-established fault models. An example of a typical memory test algorithm is the March C-test pattern, which is shown in FIG. 1. By sweeping trough the memory with these regular patterns the memory is tested for many defects.

TABLE 2

Write 0s to all cells
(i) Read 0, (ii) Write 1, (iii) Read 1 for each address, incrementing through addresses
(i) Read 1, (ii) Write 0, (iii) Read 0 for each address, incrementing through addresses
(i) Read 0, (ii) Write 1, (iii) Read 1 for each address, decrementing through addresses
(i) Read 1, (ii) Write 0, (iii) Read 0 for each address, decrementing through addresses
Read 0s from all cells Variations of such "march" pattern tests are shown in U.S. Pat. No. 5,907,561, "Method to Improve Testing Speed of Memory," and U.S. Pat. No. 6,070,256, "Method and Apparatus for Self-Testing of Multi-Port RAMs." Typically, the March C-pattern is combined with other types of test patterns, such as blanket 1s and blanket 0s, to assure full test coverage. Again, the assumption behind these patterns and data types is that the memory structure is regular and will fail according to specific ways or fault models.

When a built-in self-test (BIST) macro is employed on a memory chip, a simple compression circuit is attached to the memory's output as shown in FIG. 1 (Prior Art). The number of data outputs is non-consequential, as they are simply divided up into even and odd data groupings. The BIST provides outputs "Even Expect Data" and "Odd Expect Data" on lines 10, 12, respectively, to a compression circuit 20 which also receives Data Out 0, 1, 2 . . . n from the memory under test. The compression circuit combines the data outputs with the BIST outputs in exclusive OR gates 14a, 14b, 14c . . . 14n. Each gate will compare the data to the expected data from the BIST engine. The outputs from gates 14a, 14b, 14c . . . 14n are combined in an OR gate 16 to provide a single output "Pass/Fail" that rises if any of the memory signals were high when the BIST output indicated they should have been low. U.S. Patent U.S. Pat. No. 6,205,564 B1, "Optimized Built-In Self-Test Method and Apparauts for Random Access Memories" discusses the use of March pattern tests with BIST. A particular embodiment of BIST is discussed in U.S. Pat. No. 5,535,164, "BIST Tester for Muliple Memories," assigned to the assignee of the present invention.

Error correction codes (ECC) such as the well-known Hamming codes for double error detect, single error correct (DED/SEC) are used in higher-end memory systems to correct single bit failures (soft errors) arising from isolated events such as extraneous alpha particle radiation. Memory systems have been proposed that carry out ECC at the chip level. See for example U.S. Pat. No. 4,335,459, "Single Chip Random Access Memory With Increased Yeild and Reliability," and U.S. Pat. No. 5,134,616, "Dynamic RAM with On-Chip ECC and Optimized Bit and Word Redundancy," assigned to the assignee of the present invention.

In the past, ECC has been used primarily to correct soft errors (that is, errors that cause a particular bit to fail on a particular occasion) versus hard errors (the memory cell itself is faulty). In the past, when ECC has been used for both soft and hard error detection/recovery, (e.g. for yield enhancement purposes) some rather exotic testing methodologies have been proposed. See U.S. Pat. No. 4,891,811, "Efficient Address Test for Large Memories," assigned to the assignee of the present invention, which sequentially writes different data patterns to different addresses, and then disables the ECC and analyses the data.

Accordingly a need has developed for a simplified way of testing memory when using ECC fault detection.

BRIEF SUMMARY OF THE INVENTION

It is thus an object of the present invention to test memory when using ECC fault detection.

The foregoing and other objects of the invention are realized, in a first aspect, by a memory system that utilizes a given error recovery technique to correct errors in a given memory word at a given address, said given error recovery technique having a maxiumum number of errors it can correct in the given memory word, comprising an array of memory cells that stores a plurality of memory words, each at a given address; a first set of gates coupled to said array of memory cells that provide outputs indicative of errors in a given memory word while said given memory word is under test; and a circuit coupled to respective outputs of said first set of gates, to determine if a number of errors in said given memory word under test exceed said maxiumum number of errors correctable by said given error recovery technique, said given error recovery technique being disabled while said first set of gates and said circuit are in operation.

Another aspect of the invention is a method for testing a memory array for bit errors, the memory array utilizing a given error recovery technique to correct errors in a given memory word at a given address, said given error recovery technique having a maxiumum number of errors it can correct in the given memory word, comprising the steps of writing a plurality of test patterns to the array; comparing said written test data for a given memory word to expected data; providing outputs indicative of errors in said given memory word when said test data is inconsistent with said expected data; determining if a number of errors in said given memory word exceed said maxiumum number of errors correctable by said given error recovery technique, said given error recover technique being disabled during said method for testing.

In yet another aspect, the invention is a BIST system that utilizes ECC to correct single bit errors in a given memory word at a given address, said ECC having a maxiumum number of bit errors it can correct in the given memory word, comprising a first set of gates coupled to an array of memory cells that stores a plurality of memory words, each at a given address, said first set of gates providing bit outputs indicative of errors in a given memory word while said given memory word is under test; and a circuit coupled to respective outputs of said first set of gates, to determine if a number of errors in said given memory word under test exceed said maxiumum number of errors correctable by said given error recovery technique, said ECC being disabled while said first set of gates and said circuit are in operation.

BRIEF DESCRIPTION OF THE SEVERAL VIEWS OF THE DRAWINGS

The foregoing and other features of the invention will become more apparent upon review of the detailed description of the invention as rendered below. In the description to follow, reference will be made to the several figures of the accompanying Drawing, in which.

DETAILED DESCRIPTION OF THE INVENTION

Figure 2:
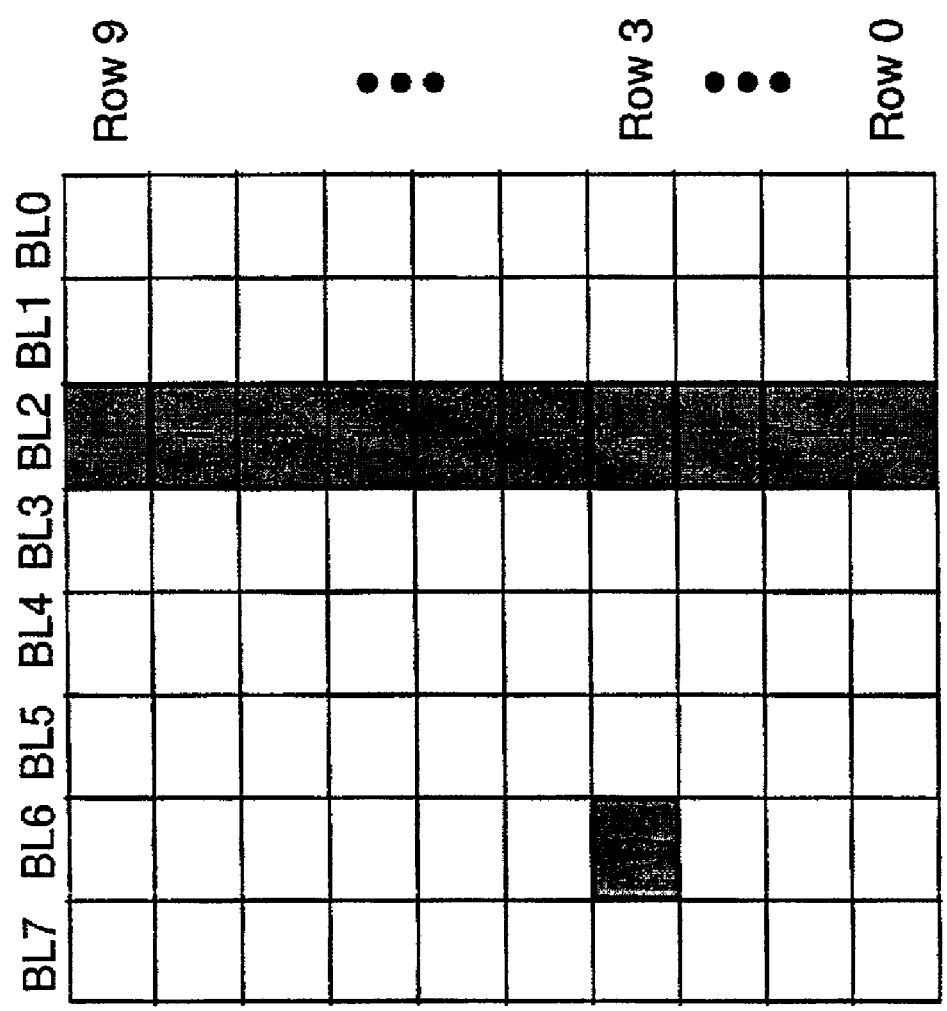
FIG. 2 is a table depicting the problems associated with carrying out pattern tests on ECC-enabled memory arrays.

When ECC is utilized as the primary memory test/ correction methodology, the memory becomes non-regular, in the sense that regular test patterns such as those set forth in Table 1 will no longer find the defects which previously were identified with normal test patterns and BIST. An example of the problem created from non-regular memory is shown in FIG. 2, where a memory array has individual cells indicated by each box. Each bit line BL0–BL7 of memory cells is shown as a column, and each word line of memory cells Row0-Row9 is shown as a row. In this example the memory has a stuck-at "1" bit line BL2, and a single cell stuck-at "0" failure in Row3. In this simplified example there are eight bits in each row, such that all eight bits are read when a given row address is selected (normally there is both row and column addressing and many more data I/O, such as 72, are read on each cycle).

Note that if an all 0s data pattern is applied to the memory, ECC would detect and correct only the failing cells on the defective bit line BL2. If an all 1s data pattern is applied to the memory, only the failing single cell is seen as incorrect by ECC and therefore is corrected. As such, ECC fault detection will prevent detection of the true number of faults, because it obscures the existence of multiple errors along the same row. When DED/SEC ECC is run on all the data, it will be unable to correct the two faults on Row3. Similar results are seen for checkerboard and inverse-checkerboard data patterns. Thus the ECC-based test strategies to date will allow certain multiple bit errors (MBE) at a given address to escape test, and hence subsequent correction. In the invention, single-cell failures are captured on a per bit basis and retained as long as the tested address does not change. These failures are examined with ECC disabled; thus all failures are visible to the test. If more than a single bit fails at a given address then it is known that ECC cannot fix these failures and therefore ECC cannot be used to enhance the yield on this chip.

Figure 3:
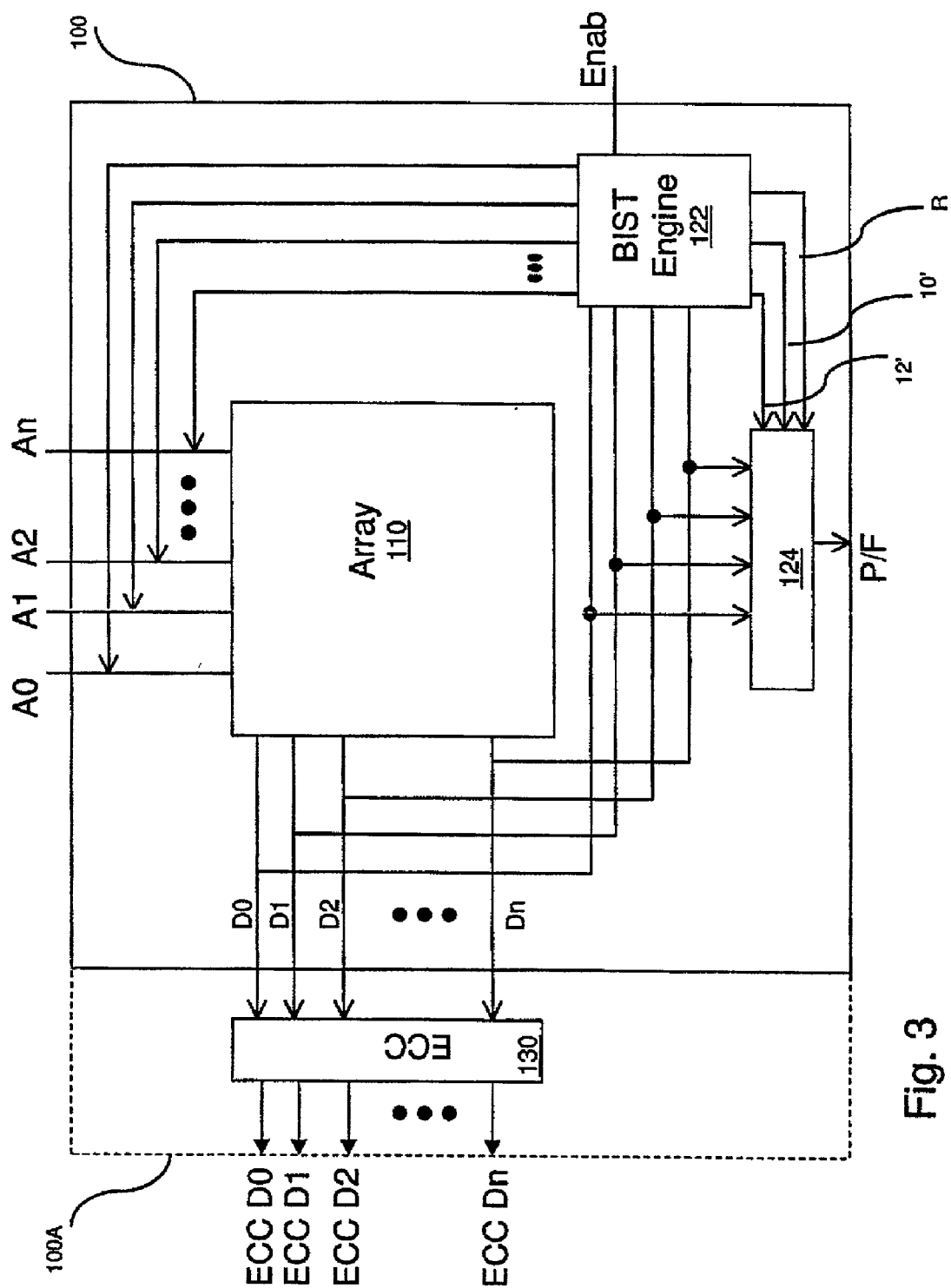
FIG. 3 is a block diagram of a memory product according to a preferred embodiment of the present invention.

FIG. 3 is a block diagram of the memory product of the invention. The memory product is preferably a single integrated circuit chip; it does not have to be, but such an arrangement minimizes cost. Note that the chip is referred to as a "memory product" because it includes a memory array 110 that stores a plurality of memory words, each with an individual address. As a practical matter this product can include extensive logic circuitry; that is, the chip could be essentially a logic product that includes the memory array. For the purposes of this discussion, each "memory word" can include one or more bytes that in turn are invidually acessible; thus, a memory word can be a portion of a word line, or an entire word line, of cells. The key is that the memory word be defined as a group of cells that can be accessed at a given address. The memory array has address inputs A0, A1, A2 . . . An, which receive addresses from off-chip sources such as the chip set, and also receive addresses from the on-chip BIST engine BIST ENG 122. While in the invention BIST is preferred as the test engine, a conventional off-chip test engine (e.g. a memory tester that applies test patterns and addresses to the memory product through its respective data and address I/O pads) could be used.

The BIST ENG 122 provides addresses, control, and data inputs to the memory. It further provides expect data for the BIST compression circuit, 124 in FIG. 3. The signals from BIST ENG 122 enable the memory to be tested with a sequence of patterns that facilitates finding defects in the memory. The BIST ENG can also be constructed in the manner taught in the aforementioned U.S. Pat. No. 5,535, 164, "BIST Tester for Muliple Memories," the teachings of which are incoporated herein by reference.

BIST ENG 122 receives an enable input Enab and provides address and data information to the array 110 during test via address inputs A0, A1, A2 . . . An, and data inputs D0, D1, D2 . . . Dn, respectively. The data outputs from array 110 are also provided to the compression circuit 124, which will be described in more detail below. Note that while shared data lines are shown, the invention can be practiced utilizing data lines that provide separate inputs/outputs to the array, the BIST ENG 122, and the compression circuit 124, respectively. The compression circuit 124 provides an output P/F that indicates the number of failing bits in a given accessed memory word exceeds the number that can be corrected by the error recovery engine employed (in this case, SEC ECC).

The outputs of the memory array are processed by DED/ SEC ECC, shown schematically as box 130. The hatching 100A indicates that as a practical matter the ECC could be embodied in hardware included in chip 100, such as in the aforementioned U.S. Pat. No. 5,134,616 (the teachings of which are incorporated herein by reference), or it could be carried out by software executed on a real-time basis. The latter is preferred, to optimize the tradeoffs between chip size and performance. The resulting data, indicated by ECC D0, ECC D1, ECC D2 . . . ECC Dn, is thus cleansed of single bit errors, and is sent to the chip set (not shown) for use by the system.

In the invention, a new test pattern is employed to facilitate revealing multi-bit failures for subsequent detection, where the failures can be of any data type, both data types must be included in a test pattern without changing the address. The new pattern is shown in Table 2 below:

TABLE 2

Write 0s to all cells
(i) Read 0, (ii) Write 1, (iii) Read 1 for each address, incrementing through addresses
(i) Read 1, (ii) Write 0, (iii) Read 0 for each address. incrementing through addresses
(i) Read 0, (ii) Write 1, (iii) Read 1 for each address, decrementing through addresses
(i) Read 1, (ii) Write 0, (iii) Read 0 for each address, decrementing through addresses
Read 0s from all cells Note that this pattern is preferably applied by the BIST ENG 122; if a conventional off-chip test machine is used, the pattern could be the same or may vary, depending on the capabilities of the test machine. The first operation (i) of step 2 reads a "0" from each cell at a given address. The third operation (iii) of step 2 reads a "1" from each cell at that same address. This combination will detect any pair of stuck-at failures, regardless of the data type and their relative location within the word being read.

Figure 1:
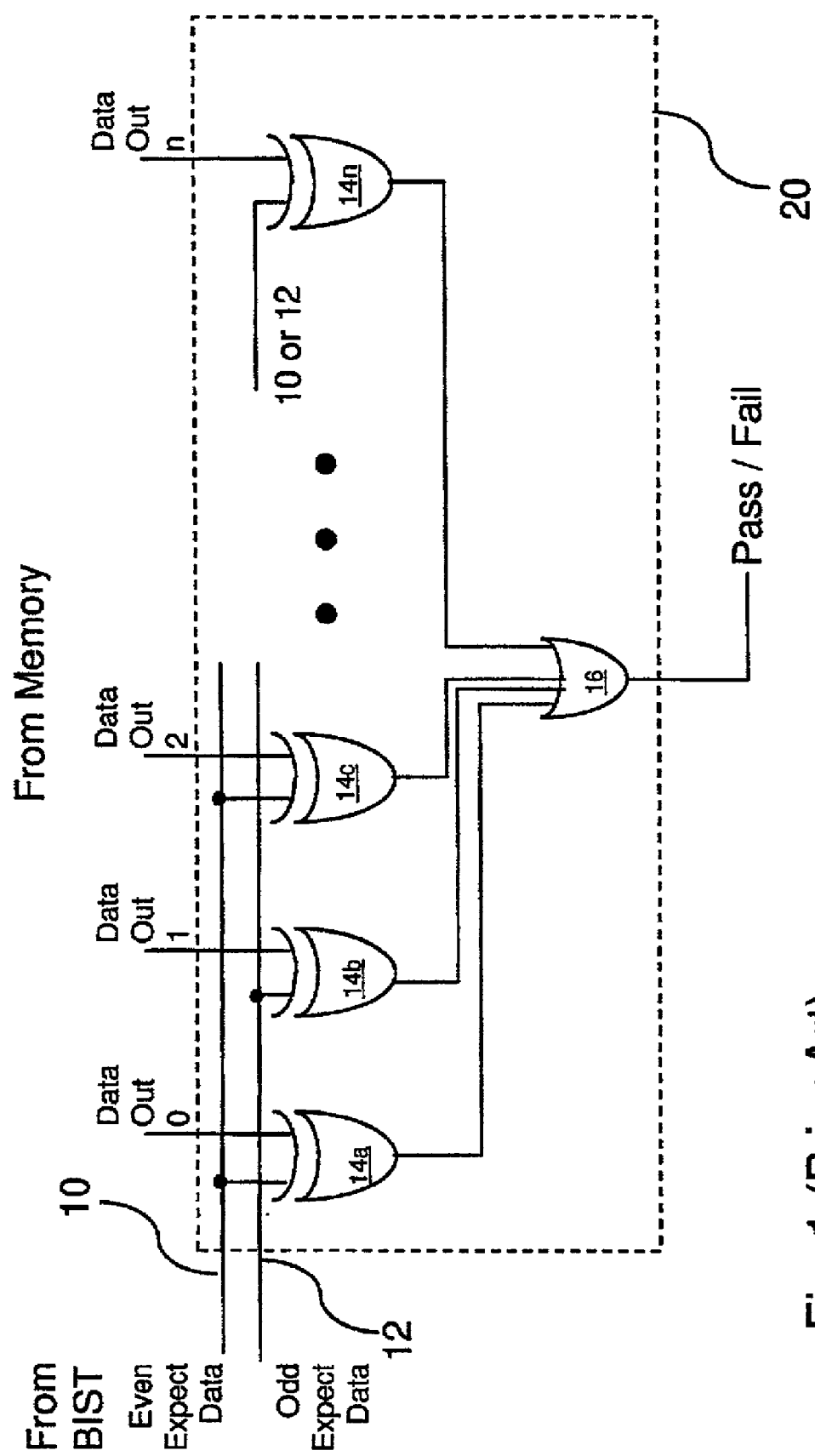
FIG. 1 (Prior Art) is a schematic of a BIST compression circuit of the prior art.
Figure 4:
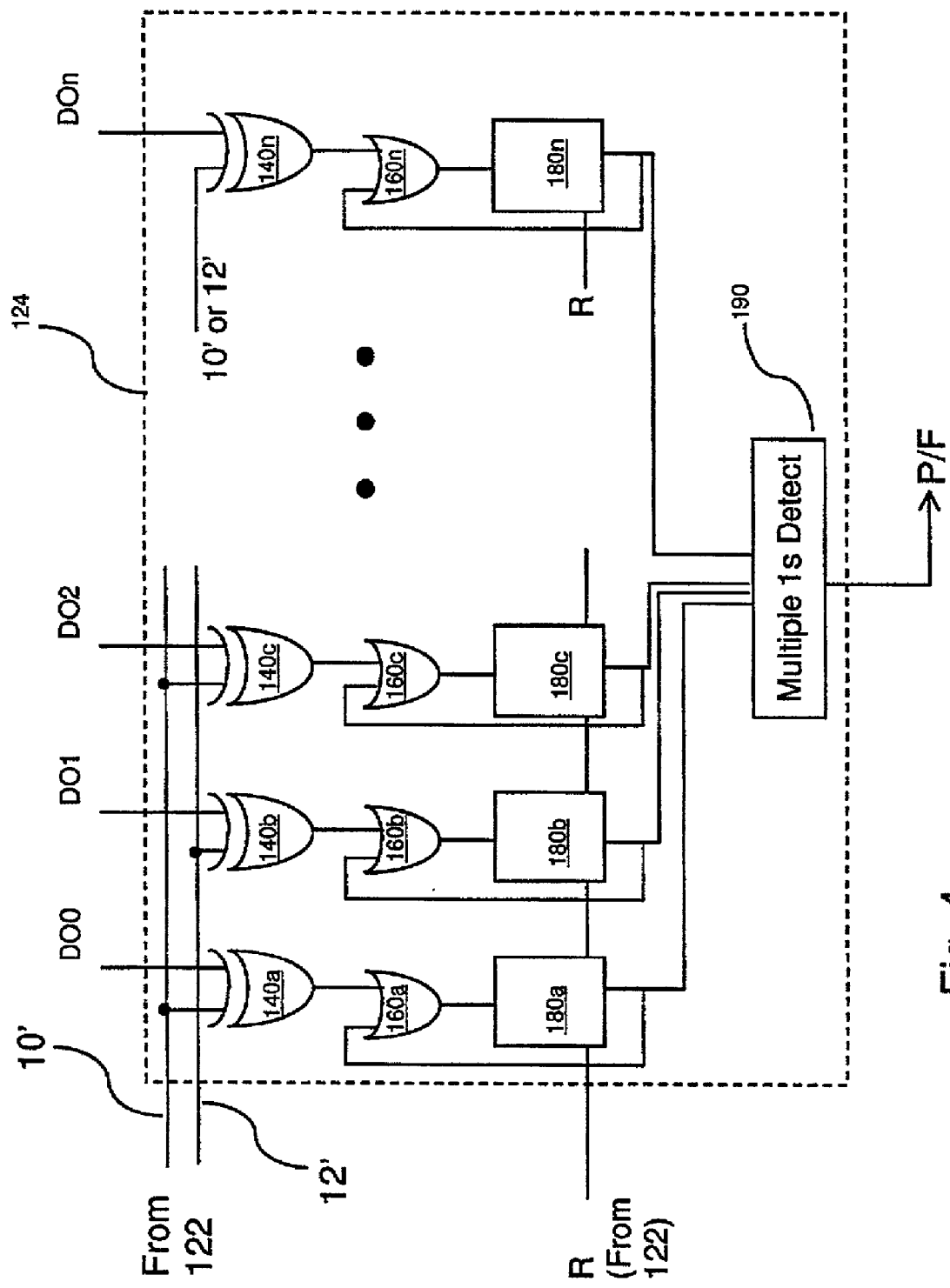
FIG. 4 is a schematic of a BIST compression circuit in accordance with a preferred embodiment of the present invention.

FIG. 4 is a schematic diagram of the output compression circuitry 124 shown in FIG. 3. As discussed with reference to FIG. 1, the BIST ENG 122 provides outputs Even Expect Data on line 10' and Odd Expect Data on line 12' to the compression circuit 124 which also receives D0, D1, D2 . . . Dn from the memory word in array 110 under test. The compression circuit combines the foregoing data outputs with the foregoing BIST ENG 122 outputs in exclusive OR gates 140a, 140b, 140c . . . 140n. Each gate will compare the data to the expected data from the BIST engine. In the invention, the outputs from gates 140a, 140b, 140c . . . 140n are combined in respective OR gates 160a, 160b, 160c . . . 160n with the output of latches 180a, 180b, 180c . . . 180n to inputs to the same respective latches. The output of the XOR gates 140a, 140b, 140c . . . 140n goes to a "1" if a data out from the memory does not match the expected data generated by the BIST engine. The group of latches 180a, 180b, 180c . . . 180n forms a resettable accumulation register. This register is reset (from enable input "Reset" or "R" from BIST ENG 122) each time the address under test changes. Thus, the 1 data from a given XOR gate 140a, 140b, 140c . . . 140n is latched by the respective latch 180a, 180b, 180c . . . 180n for a given address. The output of the latches are fed to a multiple "1" detect circuit 190, which detects if more than one latch output is high. If the output P/F of multiple "1" detect circuit 190 goes to a "1," then it is known that a failure was detected which goes beyond the capability of the fault recovery engine (in this case, the SEC ECC).

A feature of the invention is that this testing procedure is run with the ECC error correction methodology disabled. Once the test is completed, if there were no failures detected that would not be fixable by ECC error correction, ECC is enabled to fix failures in the memory words while the memory is in operation.

Note that an alternative to a resettable accumulation register 180a, 180b, 180c . . . 180n is to have the other input to OR gates 160a, 160b, 160c . . . 160n tied to a multiplexer that provides a "0" on each address change.

As a practical matter, the design of the memory product described above, or of the particular compression circuits, can be represented in software formatted in any one of a number of formats. It is preferred the design data be in an industry standard format such as GDSII. The data can be downloaded to a storage media such as tape or disc, and/or transmitted from a designer to a mask fabricator (e.g., via the Internet). The data is then used to fabricate photolithographic masks (that is, masks are made that embody the final design in the critical etch processes used to fabricate integrated circuit chips), and the masks are used to fabricate integrated circuit chips, all pursuant to conventional techniques.

The invention can be utilized in conjunction with a variety of business models. The most straightforward example is design and fabrication by a vertically integrated semiconductor manufacturer. An alternative is to have the design for the entire memory product or of the compression circuit available to customers as a macro in an ASICs library. The customer or its designee could combine such macros along with other macros to design a chip product in the manufacturer's groundrules. Or the customer could design part or all of the product on its own, and submit the design for mapping into the manufacturer's groundrules. In some scenarios the base design comes from one company, the ASIC design/mapping from a second, the masks from a third, and the chip fabrication from a fourth. Obviously all sorts of permutations and combinations of the foregoing business models are possible.

While the invention has been described above with reference to the preferred embodiments thereof, it is to be understood that the spirit and scope of the invention is not limited thereby. Rather, various modifications may be made to the invention as described above without departing from the overall scope of the invention as described above and as set forth in the several claims appended hereto. For example, the invention was described with reference to DED/SEC Hamming codes, such that if two bits were faulty in a given memory word the ECC would be unable to correct them; obviously, if a double error correct (DEC) code is used, the invention would be useful to detect situations where there are three faulty bits in the addressed word. In fact, the invention would be useful in any situation in which the faulty cell recovery methodology (be it ECC, redundancy, or some other technique) has a given maximum number of correctable bits per memory word.

What is claimed is:

1. A memory system to correct multi-bit errors in a plurality of addressable memory words comprising:
    an integrated circuit comprising an array of memory cells having a plurality of addressable rows and columns;
    a first set of gates located in said integrated circuit and coupled to said array of memory cells that provide outputs indicative of the multi-bit errors in a first memory word while said first memory word is under test; and
    a circuit located in said integrated circuit and coupled to respective outputs of said first set of gates to accumulate multi-bit errors and determine if a number of errors in said first memory word under test exceeds a maximum number of errors correctable by an error correction code circuit, said error correction code circuit being disabled while said first set of gates and said circuit are in operation.

2. The memory system of claim 1, further comprising a BIST circuit that provides a test pattern input and a memory address selected for test to said first set of gates.

3. The memory system of claim 2, wherein said inputs from said BIST circuit indicate when data from said first memory word under test is expected to be of a first logic state or a second logic state.

4. The memory system of claim 3, wherein said first set of gates comprise a set of XOR gates, each XOR gate receiving a single bit of said first memory word under test.

5. The memory system of claim 1, wherein said circuit comprises a second set of gates configured to implement an accumulator function, each one of the second set of gates coupled to a respective ones of said outputs of said first set of gates and providing outputs, and a latch coupled to said outputs of said second set of gates.

6. The memory system of claim 5, further comprising a detector circuit coupled to said latch for indicating if more than one bit is failing in said first memory word under test.

7. A method for testing an integrated circuit a memory array for multi-bit errors, the memory array utilizing an error recovery technique to correct errors in each one of a plurality of addressable memory words, said error recovery technique having a maximum number of errors it can correct in a given memory word, comprising the steps of:
    providing an integrated circuit comprising the memory array;
    writing a first test pattern to the memory array;
    comparing and accumulating written test data corresponding to the first test pattern for a first memory word to expected data;
    writing a second test pattern to the memory array;
    comparing and accumulating written test data corresponding to the second test pattern for the first memory word to expected data;
    combining written test data for the first test pattern and the second test pattern;
    providing outputs indicative of multi-bit errors in said given memory word when said test data is inconsistent with said expected data; and
    determining if the number of multi-bit errors in said first memory word exceed said maximum number of errors correctable by said error recovery technique,
    said error recover technique being disabled during said method for testing.

8. The method of claim 7, wherein said test pattern is applied by a BIST circuit.

9. The method of claim 7, wherein said accumulation of written test data reveals multi-bit fails in said first memory word.

10. The method of claim 9, wherein an exhaustive series of test patterns to detect multi-bit errors in the memory system comprises:
    Write 0s to all cells;
    (i) Read 0, (ii) Write 1, (iii) Read 1 for each address, incrementing through addresses;
    (i) Read 1, (ii) Write 0, (iii) Read 0 for each address, incrementing through addresses;
    (i) Read 0, (ii) Write 1, (iii) Read 1 for each address, decrementing through addresses;
    (i) Read 1, (ii) Write 0, (iii) Read 0 for each address, decrementing through addresses; and
    Read 0s from all cells.

11. The method of claim 7, wherein said expected data indicates when data from said given memory word is expected to be of a first logic state or a second logic state.

12. The method according to claim 7, wherein the error recovery technique comprises a combination of error correction codes and word line redundancy.

13. A BIST system that utilizes error correction codes (ECC) to correct single bit errors in a given memory word at a given address, said ECC having a maximum number of errors it can correct in the given memory word, comprising:
    a first set of gates coupled to an array of memory cells that accumulates and stores a plurality of memory words, each at a given address, said first set of gates providing bit outputs indicative of multi-bit errors in a given memory word while said given memory word is under test; and
    a circuit coupled to respective outputs of said first set of gates, to determine if a number of errors in said given memory word under test exceeds said maximum number of errors correctable by the ECC,
    said ECC being disabled while said first set of gates and said circuit are in operation.

14. The BIST system of claim 13, wherein said first set of gates comprise a set XOR gates, each XOR gate receiving a single bit of said given memory word under test.

15. The BIST system of claim 14, wherein said circuit comprises a second set of gates, each coupled to a respective ones of said outputs of said first set of gates and providing outputs, and a latch coupled to said outputs of said second set of gates.

16. The BIST system of claim 15, further comprising a detector circuit coupled to said latch for indicating if more than one bit is failing in said given memory word under test.

17. The BIST system of claim 16, wherein said BIST system provides a plurality of test patterns that reveal multi-bit fails in said given memory word.

18. The BIST system of claim 17, wherein said plurality of test patterns comprises:
    Write 0s to all cells;
    (i) Read 0, (ii) Write 1, (iii) Read 1 for each address, incrementing through addresses;
    (i) Read 1, (ii) Write 0, (iii) Read 0 for each address, incrementing through addresses;
    (i) Read 0, (ii) Write 1, (iii) Read 1 for each address, decrementing through addresses;
    (i) Read 1, (ii) Write 0, (iii) Read 0 for each address, decrementing through addresses; and
    Read 0s from all cells.

19. The memory system according to claim 1, wherein the error recovery technique comprises a combination of error correction codes and word line redundancy.

* * * * *